United States Patent [19]

Packer

[11] 4,115,157

[45] Sep. 19, 1978

[54] ORGANIC WELDING FLAX COMPOSITION

[75] Inventor: Marvin Packer, Broomall, Pa.

[73] Assignee: RCA Corporation, New York, N.Y.

[21] Appl. No.: 771,680

[22] Filed: Feb. 24, 1977

[51] Int. Cl.$^2$ .............................................. B23K 35/34
[52] U.S. Cl. ...................................................... 148/23
[58] Field of Search ..................................... 148/22–26

[56] References Cited

U.S. PATENT DOCUMENTS

| 2,684,312 | 7/1954 | Wasserman | 148/24 |
| 3,175,932 | 3/1965 | Brady | 148/23 |
| 3,309,239 | 3/1967 | Harris | 148/23 |
| 3,791,879 | 2/1974 | Goldfarb | 148/23 |

*Primary Examiner*—Peter D. Rosenberg
*Attorney, Agent, or Firm*—H. Christoffersen; Birgit E. Morris

[57] ABSTRACT

Components can be held down on a printed circuit board without lead clinching by applying a non-flowing, water soluble mixture containing a polyalkylene glycol, a starch filler and a nonionic surface active agent over the components to keep them in place during soldering operations. The mixture can be completely removed after soldering by a water rinse.

7 Claims, No Drawings

ORGANIC WELDING FLAX COMPOSITION

This invention relates to a method of assembling components on printed circuit boards. More particularly, this invention relates to a method of soldering components on printed circuit boards which avoids lead clinching.

BACKGROUND OF THE INVENTION

In a general method of assembling components on printed circuit boards, the component leads are mounted through holes punched in the board for that purpose and the leads are then clinched, or bent, to hold the components in place during subsequent fluxing, lead cutting and soldering operations. The leads are soldered to the boards and the excess leads cut off. In many cases, the cut lead ends must then be re-soldered to cover them. These operations require hand labor and many steps, which of course is expensive. Also, solder is lost on the discarded lead ends. Further, when a double soldering step is required, the danger of board warpage, due to the high temperatures involved in soldering, is increased.

With the increased complexity of electronic devices, more components are mounted on the boards, which creates more problems. The clinched leads on the boards interfere with each other, necessitating a stepwise component mounting whereby part of the components are assembled, soldered and their leads cut off before mounting additional components.

Further, it is more difficult to remove faulty components which must be replaced or repaired when the leads have been clinched, without damaging the board or other adjacent components. Still further, access to both sides of the board is required.

Thus other ways of assembling printed circuit board components without clinching leads have been sought. U.S. Pat. Nos. 2,973,499 and 3,230,612 describe adaptors or griplets which are fitted into the board holes and which receive the lead ends and pinch or grip them to hold them in place. However, these methods require additional steps and parts which also add to the expense of manufacture.

U.S. Pat. No. 3,540,718 describes a component clamp and assembly jig whereby a sliced compressible pad, as of plastic foam, is pressed against the components to keep them in place during the soldering and lead cutting steps. This method is not entirely satisfactory either because it is difficult to maintain a uniform pressure against all components, which may differ greatly in size and weight. Also, the pad tends to become impregnated with flux and solder after several operations and requires extensive cleaning to retain its resiliency.

Other means of holding the components down by means of pressure have also been tried. When all of the components are of near uniform size and weight, a bag loaded with small particles, e.g. beans or plastic shot, placed over the components will help keep them in place. However, this method also is unsatisfactory when both large and small components must be assembled in close proximity to each other, because the smaller components will not be held down properly and they may become loosened or even dislodged during soldering.

According to another method that has been tried, a molten wax coating is applied to the bottom of the board after the component leads have been inserted into the holes. After the wax cools and hardens, it holds the components in place while the leads are cut and soldered. This method has several advantages; it is particularly adapatable to automatic soldering operations and the leads can be cut prior to soldering. The solder then covers all the lead ends in one operation. In addition, the wax acts as a flux for the soldering operation. The problems with the existing wax material are that the wax smokes during soldering, which is annoying to the operator, and it must be removed either with organic solvents, which poses storage and disposal problems, or with hot water, which requires a temperature of over 150° F. which is expensive. In some instances also the soldering efficiency of the wax is inadequate for automated soldering operations, necessitating the application of a second flux over the wax coating.

Thus it would be desirable to provide an improved method of assembling components that will maintain unclinched components in place during soldering operations.

SUMMARY OF THE INVENTION

A non-flowing, completely water soluble composition has been found that can be readily applied over the components assembled on printed circuit boards by extrusion or hot melt techniques that will maintain the components in place on a printed circuit board, without clinching leads, during soldering operations, comprised of a solid polyalkylene glycol or its mixtures with a polyhydroxy alkane, a starch filler and a nonionic wetting agent. Water can be added to the mixture to improve its room temperature extrudability.

DETAILED DESCRIPTION OF THE INVENTION

The polyalkylene glycols suitable for use in the invention are polymers having the generalized formula

wherein $n$ is an integer. Those having molecular weights above about 600 and up to about 6000 are useful herein and are waxy solids. Those having molecular weights of about 3000 to 4000 are presently preferred. The polyalkylene glycols can be mixed in proportions of up to about 50% by weight with polyhydroxy alkanes, such as soluble, solid trimethylol propane. These mixtures are less brittle than either ingredient alone. These mixtures are soft, waxy solids but they have little body and they will melt well below the temperatures to which the printed circuit board will be exposed during soldering operations.

Thus a finely divided, cold water soluble starch filler is added to give body and heat resistance to the mixture. If too little starch is employed, the mixture will not hold down the components and it will melt at elevated temperatures. If too much starch is added, on the other hand, cohesiveness is inadequate. Generally, about 70 to about 100 parts of starch per 100 parts of the polyalkylene glycol ingredient is useful. The particle size of the starch is also of some importance. If the starch particles are too small, on the order of less than about 0.15 mm (0.006 inch), the mixtures, even at very high loadings, will have excessive flow characteristics. A starch particle size of about 0.25 mm or coarser is preferred.

A small amount of a nonionic surface active agent is also advantageously added to promote washability of the mixture and to ensure that no traces of the material remain on the printed circuit board or the components after water washing.

The exact proportion of the several ingredients are not critical. For 100 parts by weight of the polyalkylene glycol component, from about 70 to 100 parts by weight of starch and from about 1 to 4 parts by weight of a surface active agent gives best results. These mixtures can be readily applied by hot melt techniques to the components after they have been inserted into the board holes. More conveniently, about 20 to 40 parts by weight of water per 100 parts by weight of the polyalkylene glycol ingredient is added so that the mixtures can be extruded, as from a hand held gun, around and over the components. These mixtures will not flow into the lead holes, even after standing for several days, or when processed through a soldering operation which produces board surface temperatures of about 150° F. or higher.

The aforementioned mixtures have the additional advantage that they are completely water soluble and are readily removed after soldering by a water rinse, without staining or corroding the printed circuit board surface or the components mounted thereon.

The presently described mixtures do not flow into the lead holes and there is no interference with soldering operations; they are easily applied; they are soft enough so they do not dislodge the components during their application and they set up firmly enough to hold the components in place during lead cutting and soldering steps; and they are completely water soluble leaving no contamination of the printed circuit board surface or of the components. Further, the present mixtures are low in cost, biodegradable, simple and inexpensive to prepare from readily available ingredients.

In the described method of soldering components to printed circuit boards, whereby the foregoing mixtures are applied to the mounted components, the components soldered and the mixture washed away, an added advantage is that the component leads may be pretrimmed to a uniform length prior to mounting on the boards, thus obviating the need for cutting leads after the components are mounted.

The invention will be further illustrated by the following Examples, but it is to be understood that the invention is not meant to be limited to the details described therein. In the Examples, parts are by weight.

EXAMPLE 1

A mixture was made containing equal parts of polyethylene glycol having a molecular weight of about 3700 and polymethoxy propane. To several portions of 100 parts of this mixture were added 1 to 4 parts of isooctylphenyl polyethoxyethanol (Triton X-100 of Union Carbide Corp.), 70 to 100 parts of a nonionic soluble cornstarch (Staramic 747 available from the Staley Company) and 20 to 40 parts of water to give the proper consistency. These mixtures were room temperature extrudable and all were successful at maintaining components with precut leads in place on a printed circuit board through soldering operations.

EXAMPLE 2

Several mixtures were made containing 100 parts of the mixture of polyethylene glycol and polymethoxy propane as in Example 1, 75 to 90 parts of the starch of Example 1 and 1 to 4 parts of the detergent of Example 1. These mixtures were applied to printed circuit boards having various components with precut leads mounted thereon by hot melt extrusion. All were satisfactory in maintaining the components in place during soldering operations.

EXAMPLE 3

Washed printed circuit boards processed as in Example 1 were soaked in distilled water for 1 hour and the conductivity of the water measured. Distilled water was also measured as a control. The conductivity of the two solutions differed by less than 0.2 grains per gallon (1 grain per gallon is equivalent to 17.1 parts per million of chloride ion). This shows the mixture was completely removed without corrosion of the printed circuit board.

What is claimed is:

1. A non-flowing, water soluble composition comprising a mixture of a solid polyalkylene glycol which contains 0 up to about 50% by weight of a polyhydroxyalkane, from 1 to 20 parts by weight of a surface active agent per 100 parts of the polyalkylene glycol component and from about 70 to about 100 parts by weight of a starch filler per 100 parts of the polyalkylene glycol component.

2. A composition according to claim 1 wherein said polyalkylene glycol is polyethylene glycol having a molecular weight of about 600 to 6000.

3. A composition according to claim 1 wherein said polyhydroxyalkane is trimethylolpropane.

4. A composition according to claim 1 wherein said starch has a minimum particle size of about 0.25 mm.

5. A composition according to claim 1 wherein said composition contains water in an amount sufficient to enable said composition to be extruded at room temperature.

6. A composition according to claim 1 containing 100 parts of a mixture of equal parts by weight of a polyethylene glycol having a molecular weight of about 3700 and trimethylolpropane, from 1 to 4 parts by weight of a nonionic surface active agent and from 70 to 100 parts by weight of starch having a particle size of at least 0.25 mm and from 20 to 40 parts by weight of water.

7. A composition according to claim 1 containing 100 parts by weight of a mixture of equal parts of polyethylene glycol having a molecular weight of about 3700 and trimethylolpropane, 75 to 90 parts by weight of a starch having a minimum particle size of about 0.25 mm and from 1 to 4 parts by weight of a nonionic surface active agent.

* * * * *